US009837997B2

(12) United States Patent
Ariyama

(10) Patent No.: US 9,837,997 B2
(45) Date of Patent: Dec. 5, 2017

(54) COMPARISON CIRCUIT AND SENSOR DEVICE

(71) Applicant: SII Semiconductor Corporation, Chiba-shi, Chiba (JP)

(72) Inventor: Minoru Ariyama, Chiba (JP)

(73) Assignee: SII Semiconductor Corporation (JP)

( * ) Notice: Subject to any disclaimer, the term of this patent is extended or adjusted under 35 U.S.C. 154(b) by 20 days.

(21) Appl. No.: 15/058,787

(22) Filed: Mar. 2, 2016

(65) Prior Publication Data

US 2016/0261253 A1 Sep. 8, 2016

(30) Foreign Application Priority Data

Mar. 5, 2015 (JP) .................................. 2015-043912

(51) Int. Cl.
*H03K 5/22* (2006.01)
*H03K 5/003* (2006.01)
*H03K 5/24* (2006.01)

(52) U.S. Cl.
CPC ............. *H03K 5/003* (2013.01); *H03K 5/24* (2013.01)

(58) Field of Classification Search
CPC ........ H03K 5/2481; H03K 5/249; H03K 5/24; H03K 5/2418; G01R 19/0038
USPC .................................................... 327/63–89
See application file for complete search history.

(56) References Cited

U.S. PATENT DOCUMENTS

| 6,617,994 | B1* | 9/2003 | Heim | .................... | H03M 1/361 |
| | | | | | 341/155 |
| 7,570,044 | B2 | 8/2009 | Takeda | | |
| 2003/0090277 | A1* | 5/2003 | Lechner | .................. | G01K 7/34 |
| | | | | | 324/686 |
| 2004/0113829 | A1* | 6/2004 | Nakamoto | ............. | H03K 5/249 |
| | | | | | 341/159 |
| 2014/0232387 | A1* | 8/2014 | Muraoka | ............ | H03K 17/9517 |
| | | | | | 324/251 |

\* cited by examiner

*Primary Examiner* — Quan Tra
(74) *Attorney, Agent, or Firm* — Brinks Gilson & Lione

(57) ABSTRACT

To provide a comparison circuit capable of removing the influence of an offset voltage of a comparator in the comparison circuit and obtaining a highly accurate comparison determination result even at a high temperature. A comparison circuit is equipped with a comparator including a first input terminal inputted with a first input voltage through a first capacitor and inputted with a third input voltage through a third capacitor, a second input terminal inputted with a second input voltage through a second capacitor and inputted with a fourth input voltage through a fourth capacitor, and an output terminal; a first switch which has one end connected to the first input terminal and is turned ON in a sample phase to switch the voltage of the first input terminal to a voltage of the output terminal; and a second switch which has one end connected to the second input terminal and is turned ON in the sample phase to switch the voltage of the second input terminal to a reference voltage.

1 Claim, 6 Drawing Sheets

COMPARISON CIRCUIT AND SENSOR DEVICE

RELATED APPLICATIONS

This application claims priority under 35 U.S.C. §119 to Japanese Patent Application No. 2015-043912 filed on Mar. 5, 2015, the entire content of which is hereby incorporated by reference.

BACKGROUND OF THE INVENTION

Field of the Invention

The present invention relates to a comparison circuit which compares the magnitudes of voltages with high accuracy, and to a sensor device equipped with the same.

Background Art

In a general electronic circuit, a comparison circuit has been used as a circuit which compares a plurality of voltages and determines the magnitudes thereof (refer to, for example, Patent Document 1).

A circuit diagram of one example of a related art comparison circuit is illustrated in FIG. 7. The related art comparison circuit determines using a comparator whether the voltage of a difference between two input voltages is larger or smaller than a prescribed voltage. A problem arises in that in the above comparison, an offset voltage (input offset voltage) that the comparator has, and noise become error factors, thereby deteriorating accuracy. The above input offset voltage is generated due to a fluctuation in the characteristics of an element which configures an input circuit of the comparator by way of example. Further, the above noise is generated by flicker noise that a single transistor configuring a circuit has, and thermal noise that a single transistor or a resistive element has.

In order to reduce the influence of the offset voltage that the above-described comparator has, the comparison circuit illustrated in FIG. 7 is configured as follows. The comparison circuit has a comparator 15, a switch S13 connected between an inversion input terminal N13 of the comparator 15 and an output terminal thereof, a capacitor 13 connected between the inversion input terminal N13 of the comparator 15 and an input terminal N11, a switch S14 connected between a non-inversion input terminal N14 of the comparator 15 and a comparison voltage input terminal Nref10, a switch S11 connected between the non-inversion input terminal N14 of the comparator 15 and a connecting point N141, a capacitor 14 connected between an input terminal N12 and the connecting point N141, and a switch S12 connected between the connecting point N141 and a comparison voltage input terminal N10. Here, the voltage of the comparison voltage input terminal N10 is assumed to be V0, the voltage of the comparison voltage input terminal Nref10 is assumed to be Vref, the voltage of the input terminal N11 is assumed to be V1, the voltage of the input terminal N12 is assumed to be V2, the voltage of the inversion input terminal N13 of the comparator 15 is assumed to be VN, the voltage of the non-inversion input terminal N14 of the comparator 15 is assumed to be V4, and the voltage of the output terminal of the comparator 15 is assumed to be Vo. Further, the input offset voltage of the comparator 15 is assumed to be Voa.

The comparison circuit of FIG. 7 is operated under control of the switches S11 to S14 as illustrated in FIG. 8. One cycle of operation thereof is comprised of a sample phase φ1 and a comparison phase φ2. In the sample phase φ1, the switch S11 is turned OFF, and the switches S12 to S14 are turned ON. In the comparison phase φ2, the switch S11 is turned ON, and the switches S12 to S14 are turned OFF. φ1 or φ2 at the ends of the voltages of the connecting points and the terminals are respectively assumed to indicate the voltages in the sample phase φ1 or the comparison phase φ2.

In the sample phase φ1, the switch S11 is turned OFF and the switch S12 is turned ON to charge $\Delta VC4\phi1=V0-V2\phi1$ into the capacitor 14. Since the switch S14 is ON, $V4\phi1=Vref$ is reached. Since the comparator 15 is operated as a voltage follower circuit because the switch S13 is ON, and has the input offset voltage Voa, $Vo\phi1=V4\phi1+Voa$ is reached. Further, since the switch S13 is ON, $VN\phi1=Vo\phi1$ is reached, i.e., $VN\phi1=Vref+Voa$ is reached, so that $\Delta VC3\phi1=VN\phi1-V1\phi1=Vref+Voa-V1\phi1$ is charged into the capacitor 13. Collecting the electric charges accumulated in the capacitors 13 and 14 yields the following:

$$\Delta VC3\phi1 = Vref + Voa - V1\phi1 \qquad (A1)$$

and $$\Delta VC4\phi1 = V0 - V2\phi1 \qquad (A2)$$

In the comparison phase φ2, the switches S12 to S14 are turned OFF, and the switch S11 is turned ON. Since $\Delta VC3\phi1$ expressed in the equation (A1) is held in the capacitor 13, the voltage VN is as follows:

$$VN\phi2 = V1\phi2 + \Delta VC3\phi1 \qquad (A3)$$

On the other hand, since $\Delta VC4\phi1$ expressed in the equation (A2) is held in the capacitor 14, the voltage V4 is as follows:

$$V4\phi2 = V2\phi2 + \Delta VC4\phi1 \qquad (A4)$$

Eventually, the voltage VN expressed in the equation (A3) and the voltage V4 expressed in the equation (A4) are compared with each other in the comparator 15, and a high level or a low level is outputted from the output terminal.

Taking the input offset voltage Voa of the comparator 15 into consideration, the voltages to be compared by the comparator 15 are as follows:

$$(V4\phi2 + Voa) - VN\phi2 = \{(V2\phi2 - V1\phi2) - (V2\phi1 - V1\phi1)\} - (Vref - V0) \qquad (A5)$$

The input offset voltage Voa of the comparator 15 is not included in the equation (A5). This shows that the input offset voltage of the comparator 15 is cancelled. Thus, the input voltage component $\{(V2\phi2-V1\phi2)-(V2\phi1-V1\phi1)\}$ and the reference voltage component $(Vref-V0)$ are compared by the comparator 15 in the comparison phase φ2. From the above, it is possible to realize a comparison circuit which removes the influence of the offset voltage component of the comparator, which becomes an error factor, and provides a highly accurate output reduced in error.

[Patent Document 1] Japanese Patent Application Laid-Open No. 2008-236737

SUMMARY OF THE INVENTION

However, there has recently been a tendency for a circuit mounted on an automobile or the like to require an operation at a higher temperature and need higher accuracy. The related art comparison circuit such as described above is accompanied by a problem that in a comparison phase, an electric charge is injected into a capacitor due to an offleak current of a switch, which becomes remarkable at a high temperature, and an error occurs in the result of comparison. Concretely, in the comparison circuit of FIG. 7, a leak current of only the switch S13 flows into the capacitor 13 in the comparison phase φ2, whereas leak currents of the switches S12 and S14 flow into the capacitor 14. Therefore, the amounts of variations in the voltages at the inputs of the comparator differ on both the inversion input terminal N13 side and the non-inversion input terminal N14 side, thereby causing an error in the comparison result. Since a leak current of a transistor which configures a switch generally increases as the temperature becomes higher, an error becomes remarkable as the temperature becomes higher.

The related art comparison circuit is also accompanied by a problem that the amounts of variations in the voltages at the inputs of the comparator due to a noise component of each switch differ on both the inversion input terminal N3 side and the non-inversion input terminal N14 side because the connections of the switches to the respective capacitors are asymmetric, so that the influence of a noise component (e.g., channel charge injection or clock-field through) generated when a transistor element configuring each switch is transitioned from ON to OFF also becomes a factor of occurrence of an error.

The present invention has been made in view of such points. It is an object of the present invention to provide a comparison circuit which removes the influence of an input offset voltage of a comparator in a simple circuit configuration and suppresses the influence of errors due to an offleak current and a noise component of a switch, thereby making it possible to obtain a highly accurate comparison determination result.

In order to solve such related art problems, a comparison circuit of the present invention is configured as follows:

The comparison circuit is equipped with a comparator including a first input terminal inputted with a first input voltage through a first capacitor and inputted with a third input voltage through a third capacitor, a second input terminal inputted with a second input voltage through a second capacitor and inputted with a fourth input voltage through a fourth capacitor, and an output terminal; a first switch which has one end connected to the first input terminal and is turned ON in a sample phase to switch the voltage of the first input terminal to a voltage of the output terminal; and a second switch which has one end connected to the second input terminal and is turned ON in the sample phase to switch the voltage of the second input terminal to a reference voltage.

According to the comparison circuit of the present invention, switches, capacitors, and a comparator are effectively utilized to thereby make it possible to remove errors generated due to an offset component generated in the comparator, an offleak current component of the switch, and a noise component of the switch in a simple circuit configuration, and perform a highly accurate comparison over a wide temperature range.

DETAILED DESCRIPTION OF THE PREFERRED EMBODIMENTS

A comparison circuit of the present invention can widely be made available as a high accuracy comparison circuit in a semiconductor circuit. The comparison circuit of the present invention will hereinafter be described with reference to the accompanying drawings.

Figure 1:
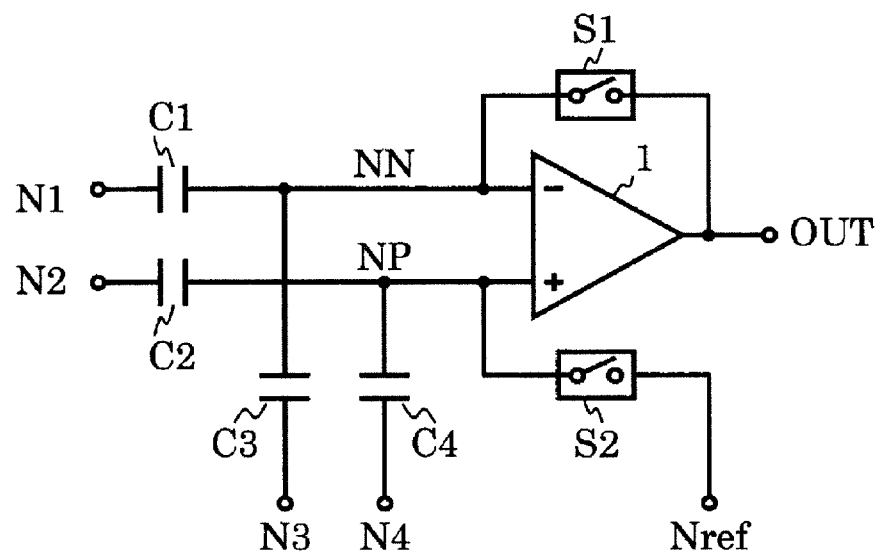
FIG. 1 is a circuit diagram of a comparison circuit according to an embodiment of the present invention.

FIG. 1 is a circuit diagram illustrating an embodiment of a comparison circuit of the present invention. The comparison circuit of the present invention is equipped with a comparator 1, capacitors C1, C2, C3, and C4, and switches S1 and S2.

The comparator 1 has an inversion input terminal NN, a non-inversion input terminal NP, and an output terminal OUT. One terminal of the capacitor C1 is connected to the inversion input terminal NN of the comparator 1, and the other terminal thereof is connected to an input terminal Ni. One terminal of the capacitor C2 is connected to the non-inversion input terminal NP of the comparator 1, and the other terminal thereof is connected to an input terminal N2. One terminal of the capacitor C3 is connected to the inversion input terminal NN of the comparator 1, and the other terminal thereof is connected to an input terminal N3. One terminal of the capacitor C4 is connected to the non-inversion input terminal NP of the comparator 1, and the other terminal thereof is connected to an input terminal N4. One terminal of the switch S1 is connected to the inversion input terminal NN of the comparator 1, and the other terminal thereof is connected to the output terminal OUT of the comparator 1. One terminal of the switch S2 is connected to the non-inversion input terminal NP of the comparator 1, and the other terminal thereof is connected to a reference voltage input terminal Nref. The switches S1 and S2 are controlled to be ON or OFF by a switch control signal (unillustrated in the circuit diagram).

In the following description, the voltages of the respective terminals N1 to N4, NN, NP, Nref, and OUT are respectively assumed to be V1 to V4, VN, VP, Vref, and Vo.

The operation of the comparison circuit of the present invention will next be described.

The operation of the comparator 1 will first be described. The comparator 1 has the function of outputting a value obtained by amplifying the difference between a pair of input voltages. Representing this amplifying function by an equation will yields the following:

$$Vo = A1 \times (VP - VN) \quad (1)$$

where A1 is an amplification factor of the comparator 1.

In the comparison circuit of FIG. 1, the inversion input terminal NN and output terminal OUT of the comparator 1 are connected to both ends of the switch S1. Since Vo and VN become voltages approximately equal to each other in a state in which the switch S1 is ON, Vo is represented from the equation (1) as follows:

$$Vo = A1/(1+A1) \times VP \quad (2)$$

Assuming that the amplification factor A1 is sufficiently large for convenience of description, the following equation is obtained:

$$Vo = VP \quad (3)$$

That is, the comparator 1 performs a voltage follower operation in the state in which the switch S1 is ON.

On the other hand, since no feedback loop is formed in the comparator 1 in a state in which the switch S1 is OFF, the comparator 1 is operated as a comparator itself From the equation (1), the comparator 1 performs a comparison operation of, in the state in which the switch S1 is OFF, amplifying a differential voltage between VP and VN with the amplification factor A1, and outputting a high level signal (generally, a positive power supply voltage level) or a low level signal (generally, a negative power supply voltage level or a GND level) from the output terminal OUT.

Now assuming that an input offset voltage of the comparator 1 is Voa at the non-inversion input terminal NN, equations each representing the operation of the comparator 1 having considered the input offset voltage are respectively given as follows from the equations (3) and (1) when the switch S1 is ON and OFF.

When the switch S1 is ON, $$Vo=VP+Voa \tag{4}$$

When the switch S1 is OFF, $$Vo=A1\times(VP+Voa-VN) \tag{5}$$

The above is the description of the operation of the comparator 1.

Figure 2:
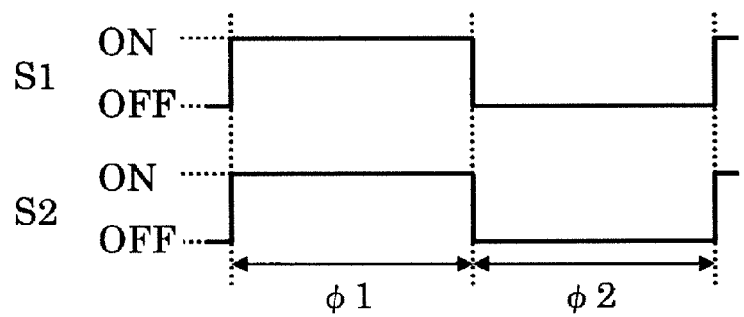
FIG. 2 is a diagram illustrating the operation of each switch in the embodiment of the present invention.

FIG. 2 is a diagram illustrating the operation of each switch.

One cycle for the comparison operation is comprised of two phases: a sample phase $\phi 1$ and a comparison phase $\phi 2$. Each of the switches S1 and S2 is controlled by a switch control signal. The switch S1 is turned ON in the sample phase $\phi 1$ and turned OFF in the comparison phase $\phi 2$. Further, the switch S2 is also similarly turned ON in the sample phase $\phi 1$ and turned OFF in the comparison phase $\phi 2$.

A description will be made about the outline of the operation of the comparison circuit of FIG. 1 in each phase.

The sample phase $\phi 1$ is a phase in which the voltage V1 of the input terminal N1, the voltage V2 of the input terminal N2, the voltage V3 of the input terminal N3, the voltage V4 of the input terminal N4, the voltage Vref of the reference voltage input terminal Nref, and the offset voltage Voa of the comparator 1 are stored in the capacitors C1, C2, C3, and C4.

The comparison phase $\phi 2$ is a phase in which a comparison between the difference in voltage between the input terminal N1 and the input terminal N2 and the difference in voltage between the input terminal N3 and the input terminal N4 is made while cancelling an offset component of the comparator 1 in the sample phase $\phi 1$.

The sample phase $\phi 1$ and the comparison phase $\phi 2$ will be described below in detail.

In the sample phase $\phi 1$, the switches S1 and S2 are turned ON. Thus, the following voltages are supplied to the respective input terminals of the comparator 1. The voltage Vo of the output terminal OUT is applied to the inversion input terminal NN of the comparator 1, and the reference voltage Vref is applied to the non-inversion input terminal NP.

$$VP\phi 1=Vref\phi 1 \tag{6}$$

Further, since the comparator 1 is operated as expressed in the equation (4) when the switch S1 is ON, the voltage VN of the inversion input terminal NN is expressed as follows:

$$VN\phi 1=Vref\phi 1+Voa\phi 1 \tag{7}$$

$\phi 1$ at the end of each voltage indicates the voltage in the sample phase $\phi 1$. Subsequently to this, other voltages and the comparison phase $\phi 2$ will also be described in like manner.

Electric charges corresponding to the difference in voltage between the two terminals of the respective capacitors and their capacitance values are accumulated in the capacitors C1, C2, C3, and C4. Assuming that their electric charge quantities are respectively Q1, Q2, Q3, and Q4, they are respectively expressed as follows:

$$Q1\phi 1=C1\times(VN\phi 1-V1\phi 1) \tag{8}$$

$$Q2\phi 1=C2\times(VP\phi 1-V2\phi 1) \tag{9}$$

$$Q3\phi 1=C3\times(VN\phi 1-V3\phi 1) \tag{10}$$

and $$Q4\phi 1=C4\times(VP\phi 1-V4\phi 1) \tag{11}$$

where the capacitance values of the capacitors C1 to C4 are respectively assumed to be C1 to C4.

On the other hand, the switches S1 and S2 are turned OFF in the comparison phase $\phi 2$. The quantities of the electric charges accumulated in the capacitors C1 to C4 in the comparison phase $\phi 2$ are respectively expressed as follows:

$$Q1\phi 2=C1\times(VN\phi 2-V1\phi 2) \tag{12}$$

$$Q2\phi 2=C2\times(VP\phi 2-V2\phi 2) \tag{13}$$

$$Q3\phi 2=C3\times(VN\phi 2-V3\phi 2) \tag{14}$$

and $$Q4\phi 2=C4\times(VP\phi 2-V4\phi 2) \tag{15}$$

Since the switch S1 is OFF, the sum of the quantities of the electric charges accumulated in the capacitors C1 and C3 does not change in the sample phase $\phi 1$ and the comparison phase $\phi 2$ by the electric charge conservation law. If this is represented by an equation, it is given as follows:

$$Q1\phi 1+Q3\phi 1=Q1\phi 2+Q3\phi 2 \tag{16}$$

Substituting the equations (8), (10), (12), and (14) into the equation (16) and solving VN$\phi 2$ yields the following equation:

$$VN\phi 2=VN\phi 1+C1/(C1+C3)\times(V1\phi 2-V1\phi 1)+C3/(C1+C3)\times(V3\phi 2-V3\phi 1) \tag{17}$$

Substituting the equation (7) into the equation (17) yields the following equation:

$$VN\phi 2=Vref\phi 1+Voa\phi 1+C1/(C1+C3)\times(V1\phi 2-V1\phi 1)+C3/(C1+C3)\times(V3\phi 2-V3\phi 1) \tag{18}$$

Further, since the switch S2 is OFF as with the switch S1, the sum of the quantities of the electric charges accumulated in the capacitors C2 and C4 does not change in the sample phase $\phi 1$ and the comparison phase $\phi 2$ by the electric charge conservation law and is represented by the following equation:

$$Q2\phi 1+Q4\phi 1=Q2\phi 2+Q4\phi 2 \tag{19}$$

Substituting the equations (9), (11), (13), and (15) into the equation (19) and solving VP$\phi 2$ yields the following equation:

$$VP\phi 2=VP\phi 1+C2/(C2+C4)\times(V2\phi 2-V2\phi 1)+C4/(C2+C4)\times(V4\phi 2-V4\phi 1) \tag{20}$$

Substituting the equation (6) into the equation (20) yields the following equation:

$$VP\phi 2=Vref\phi 1+C2/(C2+C4)\times(V2\phi 2-V2\phi 1)+C4/(C2+C4)\times(V4\phi 2-V4\phi 1) \tag{21}$$

Further, since the comparator 1 is operated as expressed in the equation (5) when the switch S1 is OFF, the voltage Vo of the output terminal OUT of the comparator 1 is expressed as follows:

$$Vo\phi2 = A1 \times (VP\phi2 + Voa\phi2 - VN\phi2) \quad (22)$$

Substituting $VN\phi2$ expressed in the equation (18) and $VP\phi2$ expressed in the equation (21) into the above equation (22) yields the following equation:

$$Vo\phi2 = A1 \times \{-C1/(C1+C3) \times (V1\phi2 - V1\phi1) + C2/(C2+C4) \times (V2\phi2 - V2\phi1) - C3/(C1+C3) \times (V3\phi2 - V3\phi1) + C4/(C2+C4) \times (V4\phi2 - V4\phi1) + (Voa\phi2 - Voa\phi1)\} \quad (23)$$

Assuming that subsequently, for convenience of description, the capacitance values of C1 and C2 are equal to a capacitance value C, and the capacitance values of C3 and C4 are equal to n times the capacitance value C, the equation (23) is expressed as follows:

$$Vo\phi2 = A1 \times [1/(1+n) \times \{(V2\phi2 - V2\phi1) - (V1\phi2 - V1\phi1)\} - n/(1+n) \times \{(V3\phi2 - V3\phi1) - (V4\phi2 - V\phi1)\} + (Voa\phi2 - Voa\phi1)\}] \quad (24)$$

Assuming that in order to make it easy to understand the equation (24), the voltage components supplied from the input terminal N1 and the input terminal N2 are defined as ΔVin, and the voltage components supplied from the input terminal N3 and the input terminal N4 are defined as ΔVref, the equation (24) is expressed as follows:

$$Vo\phi2 = A1 \times \{(\Delta Vin - n \times \Delta Vref)/(1+n) + (Voa\phi2 - Voa\phi1)\} \quad (25)$$

where $$\Delta Vin = (V2\phi2 - V1\phi2) - (V2\phi1 - V1\phi1) \quad (26) \text{ and}$$

$$\Delta Vref = -\{(V4\phi2 - V3\phi2) - (V4\phi1 - V3\phi1)\} \quad (27)$$

Now, although the input offset voltage Voa of the comparator 1 is not a constant value because it strictly indicates a temporary change in the input offset voltage and a change therein with temperature (temperature drift), the value of the input offset voltage can be assumed to be values approximately equal in the sample phase $\phi1$ and the comparison phase $\phi2$ if the times for the sample phase $\phi1$ and the comparison phase $\phi2$ are sufficiently short with respect to the temporary change in the input offset voltage and the change in the input offset voltage with temperature. Accordingly, in the equation (25), $Voa\phi2 - Voa\phi1$ becomes a value of approximately zero, and the offset component of the comparator 1 is removed at the comparison operation of the comparator 1 in the comparison phase $\phi2$. Thus, the equation (25) is expressed as follows:

$$Vo\phi2 = A1 \times \{(\Delta Vin - n \times \Delta Vref)/(1+n)\} \quad (28)$$

Thus, a result of comparison between the voltage components ΔVin supplied from the input terminal N1 and the input terminal N2, and the voltage components ΔVref supplied from the input terminal N3 and the input terminal N4 is amplified with the sufficiently large amplification factor A1. Eventually, this is outputted as a high level signal or a low level signal from the output terminal OUT of the comparator 1. That is, it is possible to remove the influence of an offset voltage being an error component and obtain a highly accurate comparison result.

Now, when the voltages of the input terminals N1 and N2, which determine ΔVin, are inputted to be $V2\phi2 = V1\phi1 = V2'$, and $V1\phi2 = V2\phi1 = V1'$, for example, ΔVin becomes $\Delta Vin = 2 \times (V2' - V1')$ from the equation (26), and a voltage obtained by doubling a difference between V2' and V1' is inputted to the comparator 1 as an input voltage component.

On the other hand, when the voltages of the input terminals N3 and N4, which determine ΔVref, are inputted to be $V4\phi2 = V3\phi1 = V4'$, and $V3\phi2 = V4\phi1 = V3'$, for example, ΔVref becomes $\Delta Vref = 2 \times (V3' - V4')$ from the equation (27), and a voltage obtained by doubling a difference between V3' and V4' is inputted to the comparator 1 as an input voltage component.

For simplicity, assuming that the capacitance values of the capacitors C1 and C2 are selected such that n=1 is reached, the equation (28) is as follows in the case of this example:

$$Vo\phi2 = A1 \times \{(V2' - V1') - (V3' - V4')\} \quad (29)$$

A result of comparison between the input voltage (V2'−V1') and the input voltage (V3'−V4') is obtained from the output terminal.

When attention is paid to the equation (23) here, the term of Vref is not included in the equation. This is because the term of $Vref\phi1$ is included in both of $VN\phi2$ expressed in the equation (18) and $VP\phi2$ expressed in the equation (21), and the term of Vref is cancelled when these are substituted into $Vo\phi2$ expressed in the equation (21). This indicates that in the comparison circuit of the present invention, the result of comparison does not depend on the voltage of Vref even if the voltage Vref applied to the reference voltage input terminal Nref is any value. In an actual circuit, the range of the voltage inputable to the comparator 1 is subject to the constraint of an in-phase input voltage range. When it deviates from this voltage range, there is a possibility that a highly accurate comparison will normally not be carried out. The comparison circuit of the present invention has an advantage that the highly accurate comparison is made possible by selecting the voltage of the reference voltage input terminal Nref so as to fall within the in-phase input voltage range of the comparator 1 even if the voltages of the input terminal N1, the input terminal N2, the input terminal N3, and the input terminal N4 are voltages beyond the in-phase input voltage range of the comparator 1. If an alternate expression is taken, the comparison circuit has an advantage that the in-phase input voltage range required of the comparator 1 can greatly be relaxed.

The effect of bringing the connections of the switches S1 and S2 to the configuration of the present invention will next be described. As the ideal characteristic of each switch in the OFF state, there is mentioned that the resistance value is made large without limit, i.e., no current flows between the terminals. In the actual circuit, however, a leak current flows between the terminals of the switch. Therefore, although there are mentioned many configurations of switch circuits for reducing the leak current, the leak current does not reach zero and assumes an finite value. In a comparison circuit using capacitors and switches, a leak current of each switch at its OFF flows into the capacitor so that the quantity of an electric charge accumulated in the capacitor changes, thus leading to the occurrence of an error in a comparison result. Also, since the leak current generally tends to increase with raising of the temperature, an error in the comparison circuit tends to increase as the temperature becomes higher.

In the circuit configuration of the present invention, the switches S1 and S2 are respectively connected to a connecting point of one terminal of the capacitor C1, one terminal of the capacitor C3, and the inversion input terminal NN of the comparator 1, and a connecting point of one terminal of the capacitor C2, one terminal of the capacitor C4, and the non-inversion input terminal NP of the comparator 1 so as to be symmetrical with each other. Therefore, even if a leak current occurs in the switches S1 and S2 when the switches S1 and S2 are OFF in the comparison phase $\phi2$, the leak current of each switch flows into each connecting point substantially equally by adopting switches having characteristics substantially equivalent to the switches S1 and S2. Thus, although the voltage VN of the inversion input terminal NN and the voltage VP of the non-inversion input terminal NP change respectively, the switches are operated such that the amounts of changes in the voltages become approximately equal to each other. Accordingly, the comparison circuit has a configurational advantage that the value of VP–VN corresponding to the difference in voltage remains unchanged and consequently, an error in the result of comparison becomes minimal, thereby making it possible to obtain a highly accurate comparison determination result.

Further, as non-ideal components of the switch, there are mentioned a noise component generated when a transistor element configuring the switch is transitioned from ON to OFF, e.g., channel charge injection and clock-field through in addition to the above-described leak current. In the circuit configuration of the present invention, the switches S1 and S2 are respectively connected to the connecting point of one terminal of the capacitor C1, one terminal of the capacitor C3, and the inversion input terminal NN of the comparator 1, and the connecting point of one terminal of the capacitor C2, one terminal of the capacitor C4, and the non-inversion input terminal NP of the comparator 1 so as to be symmetrical with each other. Therefore, the electric charges generated by the noise components of the switches are injected into the respective connecting points substantially equally. Thus, the switches are operated such that, although the voltage VN of the inversion input terminal NN and the voltage VP of the non-inversion input terminal NP change respectively, the amounts of changes in the voltages become approximately equal to each other. This is similar as in the case of the leak current. Thus, the comparison circuit has a configuration advantage that it is possible to suppress the influence of an error due to the noise components generated when the switch is transitioned from the ON state to the OFF state and obtain a highly accurate comparison determination result.

Although the timing chart for the specific switch control is illustrated in the present description, the configuration of performing the operation described in the present description is not necessarily limited to this timing. Although the timing at which ON or OFF of the switch is switched upon transition of the switch from the sample phase φ1 to the comparison phase φ2 or vice versa is described to be simultaneously taken, the switches may be controlled while shifting the timing in such a manner that the switch S2 is turned OFF after the turning OFF of the switch S1. When the comparator 1 is good in transient response characteristic, and when a parasitic capacitance between the inversion input terminal NN of the comparator 1 and the non-inversion input terminal NP thereof is such a magnitude as cannot be ignored, there is a case where a switching noise generated when the switch S2 is turned OFF is propagated from the non-inversion input terminal NP to the inversion input terminal NN to cause an ineligible error in the voltage charged to the capacitor C1. In such a case, the timing provided to turn OFF the switch S2 may more preferably be delayed with respect to the timing provided to turn OFF the switch S1.

Also, although the relationship between the capacitance values of the capacitors C1 to C4 has been described by taking the specific ratio in the present description, the ratio may not be necessarily the ratio illustrated in the description.

Further, although the present description has been made by taking one example of the input voltages applied to the input terminal N1 and the input terminal N2 and one example of the voltages applied to the input terminal N3 and the input terminal N4, they are not necessarily limited to the examples. When the comparison circuit of the present embodiment is applied to the signal detection circuit which performs the logic output according to the strength of the physical quantity applied to the sensor element as illustrated in the related art, for example, examples of the input voltage components are as follows:

$$V1\phi1 = Vcm\phi1 + Vsig\phi1 + Voff\phi1$$

$$V2\phi1 = Vcm\phi1 - Vsig\phi1 - Voff\phi1$$

$$V1\phi2 = Vcm\phi2 - Vsig\phi2 + Voff\phi2 \text{ and}$$

$$V2\phi2 = Vcm\phi2 + Vsig\phi2 - Voff\phi2$$

where Vcm is an in-phase voltage component of a signal voltage of the sensor element, Vsig is a signal voltage component of the sensor element, and Voff is an offset voltage component (error factor) of the sensor element. Substituting the above input voltages into the equation (26) yields the following:

$$\Delta Vin = 2 \times (Vsig\phi2 + Vsig\phi1) - 2 \times (Voff\phi2 - Voff\phi1) \quad (30)$$

Since the offset voltage components of the sensor element indicate the values approximately equal to each other in the sample phase φ1 and the comparison phase φ2, they are cancelled. Accordingly, only the signal voltage component of the sensor element is inputted to the comparator 1 as the input voltage component ΔVin. The case of such an input voltage component is not departed either in terms of the gist of the present invention, i.e., removing the influence of the input offset voltage of the comparator and suppressing the influence of the error due to the offleak current of each switch and the noise component thereof to thereby obtain the highly accurate comparison determination result.

Figure 3:
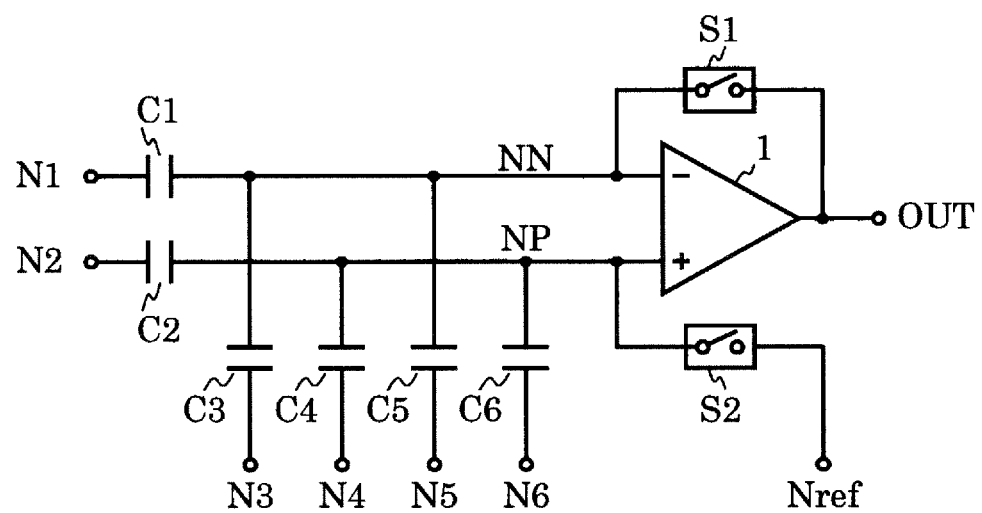
FIG. 3 is a circuit diagram of another example of the embodiment of the present invention.

FIG. 3 is a circuit diagram of another example of the embodiment of the present invention. A difference from the circuit diagram illustrated in FIG. 1 resides in that capacitors C5 and C6 are added. The added elements are configured and connected as follows:

One terminal of the capacitor C5 is connected to an inversion input terminal NN of a comparator 1, and the other terminal thereof is connected to an input terminal N5. One terminal of the capacitor C6 is connected to a non-inversion input terminal NP of the comparator 1, and the other terminal thereof is connected to an input terminal N6. Other connections and configurations are the same as the embodiment of the present invention illustrated in FIG. 1.

The operation of the comparison circuit in the present invention will next be described.

Switches S1 and S2 are controlled in a manner similar to the case of the circuit illustrated in FIG. 1 and operated as illustrated in FIG. 2.

In the sample phase φ1, the switches S1 and S2 are turned ON, and electric charge quantities Q5 and Q6 expressed in the following equations are respectively accumulated in the capacitors C5 and C6 in addition to electrical charge quantities similar to the equations (8) to (11) being accumulated in capacitors C1 to C4:

$$Q5\phi1 = C5 \times (VN\phi1 - V5\phi1) \quad (31) \text{ and}$$

$$Q6\phi1 = C6 \times (VP\phi1 - V6\phi1) \quad (32)$$

On the other hand, in the comparison phase φ2, the switches S1 and S2 are OFF, and electric charge quantities Q5 and Q6 expressed in the following equations are respectively accumulated in the capacitors C5 and C6 in addition to electrical charge quantities similar to the equations (12) to (15) being accumulated in the capacitors C1 to C4:

$$Q5\phi2 = C5 \times (VN\phi2 - V5\phi2) \quad (33)$$ and $$Q6\phi2 = C6 \times (VP\phi2 - V6\phi2) \quad (34)$$

Since the switch S1 is OFF, the sum of the electric charges accumulated in the capacitors C1, C3 and C5 does not change in the sample phase ϕ1 and the comparison phase ϕ2 by the electric charge conservation law as with the case of FIG. 1. If this is represented by an equation, it is given as follows:

$$Q1\phi1 + Q3\phi1 + Q5\phi1 = Q1\phi2 + Q3\phi2 + Q5\phi2 \quad (35)$$

Substituting the equations (8), (10), (12), (14), (31), and (33) into the equation (35) and solving VNϕ2 yields the following equation:

$$VN\phi2 = VN\phi1 + C1/(C1+C3+C5) \times (V1\phi2-V1\phi1) + C3/(C1+C3+C5) \times (V3\phi2-V3\phi1) + C5/(C1+C3+C5) \times (V5\phi2-V5\phi1) \quad (36)$$

Substituting the equation (7) into the equation (36) yields the following equation:

$$VN\phi2 = Vref\phi1 + Voa\phi1 + C1/(C1+C3+C5) \times (V1\phi2-V1\phi1) + C3/(C1+C3+C5) \times (V3\phi2-V3\phi1) + C5/(C1+C3+C5) \times (V5\phi2-V5\phi1) \quad (37)$$

Further, since the switch S2 is OFF as with the switch S1, the sum of the electric charge quantities accumulated in the capacitors C2, C4, and C6 does not change in the sample phase ϕ1 and the comparison phase ϕ2 by the electric charge conservation law in a manner similar to the case of FIG. 1 and is represented by the following equation:

$$Q2\phi1 + Q4\phi1 + Q6\phi1 = Q2\phi2 + Q4\phi2 + Q6\phi2 \quad (38)$$

Substituting the equations (9), (11), (13), (15), (32), and (34) into the equation (38) and solving VPϕ2 yields the following equation:

$$VP\phi2 = VP\phi1 + C2/(C2+C4+C6) \times (V2\phi2-V2\phi1) + C4/(C2+C4+C6) \times (V4\phi2-V4\phi1) + C6/(C2+C4+C6) \times (V6\phi2-V6\phi1) \quad (39)$$

Substituting the equation (6) into the equation (39) yields the following equation:

$$VP\phi2 = Vref\phi1 + C2/(C2+C4+C6) \times (V2\phi2-V2\phi1) + C4/(C2+C4+C6) \times (V4\phi2-V4\phi1) + C6/(C2+C4+C6) \times (V6\phi2-V6\phi1) \quad (40)$$

When the switch S1 is OFF, the voltage Vo of the output terminal OUT of the comparator 1 is expressed like the equation (22) as with the case of FIG. 1. Substituting VNϕ2 expressed in the equation (37) and VPϕ2 expressed in the equation (40) into the equation (22) yields the following equation:

$$Vo\phi2 = A1 \times \{-C1/(C1+C3+C5) \times (V1\phi2-V1\phi1) + C2/(C2+C4+C6) \times (V2\phi2-V2\phi1) - C3/(C1+C3+C5) \times (V3\phi2-V3\phi1) + C4/(C2+C4+C6) \times (V4\phi2-V4\phi1) - C5/(C1+C3+C5) \times (V5\phi2-V5\phi1) + C6/(C2+C4+C6) \times (V6\phi2-V6\phi1) + (Voa\phi2-Voa\phi1)\} \quad (41)$$

Subsequently, for convenience of description, when the capacitance values of the capacitors C1 and C2 are assumed to be equal to the capacitance value C, the capacitance values of the capacitors C3 and C4 are assumed to be equal to n times the capacitance value C, and the capacitance value of the capacitors C5 and C6 are assumed to be equal to m times the capacitance value C, the equation (41) is expressed as follows:

$$Vo\phi2 = A1 \times [+1/(1+n+m) \times \{(V2\phi2-V2\phi1)-(V1\phi2-V1\phi1)\} + n/(1+n+m) \times \{(V4\phi2-V4\phi1)-(V3\phi2-$$

$$V3\phi1)\} + m/(1+n+m) \times \{(V6\phi2-V6\phi1)-(V5\phi2-V5\phi1)\} + (Voa\phi2-Voa\phi1)\}] \quad (42)$$

In order to make it easy to understand the equation (42), as with the case of the description in FIG. 1, the voltage components supplied from the input terminals N1 and N2 are taken to be ΔVin, the voltage components supplied from the input terminals N3 and N4 are taken to be ΔVref, and the voltage components supplied from the input terminals N5 and N6 are taken to be ΔVin2. Consequently, the equation (42) can be expressed as follows:

$$Vo\phi2 = A1 \times \{(\Delta Vin - n \times \Delta Vref + m \times \Delta Vin2)/(1+n+m) + (Voa\phi2-Voa\phi1)\} \quad (43)$$

where ΔVin is similar to the equation (26), and ΔVref is similar to the equation (27).

$$\Delta Vin = (V2\phi2-V1\phi2)-(V2\phi1-V1\phi1) \quad (26)$$

$$\Delta Vref = -\{(V4\phi2-V3\phi2)-(V4\phi1-V3\phi1)\} \quad (27)$$ and $$\Delta Vin2 = (V2\phi2-V1\phi2)-V2\phi1-V1\phi1) \quad (44)$$

Here, since the input offset voltage Voa of the comparator 1 can be assumed to be approximately equal in value in the sample phase ϕ1 and the comparison phase ϕ2 as with the case of the description of FIG. 1, the equation (43) can be expressed as follows:

$$Vo\phi2 = A1 \times \{(\Delta V - n \times \Delta Vref + m \times \Delta Vin2/(1+n+m)\} \quad (45)$$

Thus, a result obtained by comparing the voltage components ΔVin supplied from the input terminals N1 and N2, the sum of m times the voltage components ΔVin2 supplied from the input terminals N5 and N6, and n times the voltage components ΔVref supplied from the input terminals N3 and N4 is amplified with a sufficiently large amplification factor A1 and eventually outputted as a high level signal or a low level signal from the output terminal OUT of the comparator 1. That is, it is possible to remove the influence of an offset voltage being an error component and obtain a highly accurate comparison result.

Further, the term of Vref is not included in the equation (45) as with the equation (23) in the case of FIG. 1. Thus, it can be said that the present configuration also has an advantage that the in-phase input voltage range required of the comparator 1 can greatly be relaxed. Moreover, the connection of the switches S1 and S2 also has a configurational advantage that since the switches S1 and S2 are connected so as to be symmetrical with the inversion input terminal NN and non-inversion input terminal NP of the comparator 1 as with the case of FIG. 1, an error due to the influence of a leak current being a non-ideal component of each switch or a noise component generated upon transition of the switch from ON to OFF becomes minimal, and hence a highly accurate comparison determination result can be obtained.

In the description of FIG. 1, there has been mentioned the case where the comparison circuit of the present embodiment is applied to the signal detection circuit which performs the logic output according to the strength of the physical quantity applied to the sensor element, such as illustrated in the related art. Similarly even in the present circuit configuration illustrated in FIG. 3, when a signal of the sensor element is inputted to ΔVin and a signal of another sensor element is inputted to ΔVin2, the sum of signal voltage components of the sensor element and another sensor element from which in-phase voltage components and offset voltage components (error factors) of signal voltages of the sensor element and another sensor element are removed, and ΔVref can be compared with high accuracy.

Further, if the following is taken instead of the equation (44):

$$\Delta Vin2 = -[(V2\phi2 - V1\phi2) - (V2\phi1 - V1\phi1)] \quad (44')$$

the equation (45) is expressed as follows:

$$Vo\phi2 = A1 \times [\{\Delta Vin - (n \times \Delta Vref + m + \Delta Vin2)\}/(1 + n + m)] \quad (46)$$

It is understood from the above description and the equation (46) that when the signal of the sensor element is inputted to ΔVin, and the reference voltage component is inputted to ΔVref and ΔVin2, the signal voltage component of the sensor element and the sum of the reference voltage components ΔVref and ΔVin can be compared with high accuracy.

Figure 4:
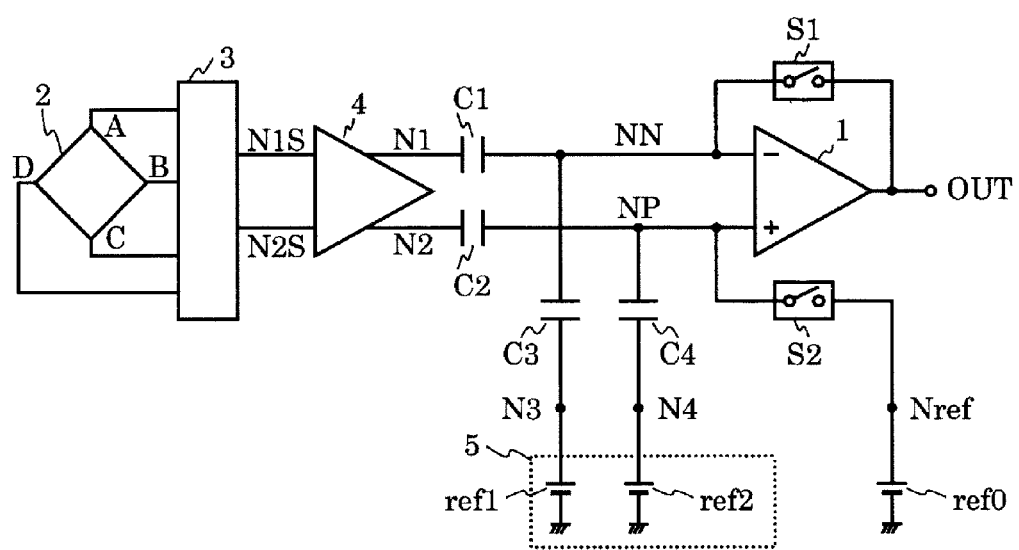
FIG. 4 is a circuit diagram of an example of applying the embodiment of the present invention to a magnetic sensor device.

FIG. 4 is a circuit diagram of an example of applying the embodiment of the present invention to a magnetic sensor device. The magnetic sensor device of FIG. 4 is additionally provided with the comparison circuit of FIG. 1, a hall element 2 being a magnetoelectric conversion element, a switch circuit 3, a differential amplifier 4, a detection voltage setting circuit 5, and a reference voltage circuit ref0. The detection voltage setting circuit 5 is comprised of a reference voltage circuit ref1 and a reference voltage circuit ref2.

The added elements are configured and connected in the following manner. The hall element 2 is provided with a first terminal pair A-C, and a second terminal pair B-D. The switch circuit 3 has four input terminals connected to the terminals A, B, C, and D of the hall element 1, a first output terminal, and a second output terminal. The differential amplifier 4 has a first input terminal N1S and a second input terminal N2S to which the first output terminal and second output terminal of the switch circuit 3 are respectively connected, a first output terminal N1 connected to an input terminal N1 used as the other terminal of the capacitor C1, and a second output terminal N2 connected to an input terminal N2 used as the other terminal of the capacitor C2. An input terminal N3 connected to the other terminal of the capacitor C3 is connected to a positive electrode of the reference voltage circuit ref1. An input terminal N4 connected to the other terminal of the capacitor C4 is connected to a positive electrode of the reference voltage circuit ref2. A reference voltage input terminal Nref connected to the other terminal of the switch S2 is connected to a positive electrode of the reference voltage circuit ref0. Other connections and configurations are the same as those in the embodiment of the present invention illustrated in FIG. 1.

The operation of the magnetic sensor device of the present application will next be described.

The switch circuit 3 has the function of switching a first detection state T1 in which a power supply voltage is inputted to the first terminal pair A-C of the hall element 2, and a signal voltage is outputted from the second terminal pair B-D, and a second detection state T2 in which the power supply voltage is inputted to the second terminal pair B-D, and a signal voltage is outputted from the first terminal pair A-C.

The hall element 2 outputs a signal voltage corresponding to a magnetic field intensity (or magnetic flux density) and outputs an offset voltage being an error component. In the following description, the hall element 2 is assumed to be in the first detection state T1 in a sample phase φ1, and in the second detection state T2 in a comparison phase φ2. Further, assuming that as for an element signal voltage Vh and an offset voltage Voh of the hall element 2, the element signal voltage Vh is opposite in phase and the offset voltage Voh is in phase in the first detection state T1 and the second detection state T2, voltages V1S and V2S of the terminals N1S and N2S in the respective phases φ1 and φ2 are expressed in the following equations:

$$V1S\phi1 = Vcm1 + Vh1/2 + Voh1/2 \quad (47)$$

$$V2S\phi1 = Vcm1 - Vh1/2 - Voh1/2 \quad (48)$$

$$V1S\phi2 = Vcm2 - Vh2/2 + Voh2/2 \quad (49) \text{ and}$$

$$V2S\phi2 = Vcm2 + Vh2/2 - Voh2/2 \quad (50)$$

Here, "1" or "2" appended to the ends of the element in-phase voltage Vcm, element signal voltage Vh and offset voltage Voh of the hall element 2 indicates that the detected states of the hall element 2 and the switch circuit 3 are respectively values in the first detection state T1 and the second detection state T2. Voltages inputted to the differential amplifier 4 in the respective phases are expressed in the following manner by the equations (47) to (50):

$$V2S\phi1 - V1S\phi1 = -Vh1 - Voh1 \quad (51) \text{ and}$$

$$V2S\phi2 - V1S\phi2 = +Vh2 - Voh2 \quad (52)$$

The differential amplifier 4 has the function amplifying a difference between the two input voltages and outputting the amplified difference as a difference between two output voltages. If this amplifying function is expressed in an equation, it is given as follows:

$$V2 - V1 = G \times (V2S - V1S) \quad (53)$$

where G indicates an amplification factor of the differential amplifier, and V1 and V2 indicate voltages at the terminals N1 and N2. Further, when input offset voltages at the input terminals N1S and N2S of the differential amplifier 4 are taken into consideration as Voa1 and Voa2, the equation (53) is expressed as follows:

$$V2 - V1 = G \times (V2S - V1S) + G \times (Voa2 - Voa1) \quad (54)$$

Thus, as the output of the differential amplifier 4, not only the difference V2S−V1S between the input voltages but also the difference Voa2 Voa1 between the input offset voltages is multiplied by the amplification factor G, followed by being outputted from the differential amplifier 4. The differential output V2−V1 of the differential amplifier 4 in each phase is expressed in the following manner from the equation (54):

$$V2\phi1 - V1\phi1 = G \times (V2S\phi1 - V1S\phi1) + G \times (Voa2\phi1 - Voa1\phi1) \quad (55) \text{ and}$$

$$V2\phi2 - V1\phi2 = G \times (V2S\phi2 - V1S\phi2) + G \times (Voa2\phi2 - Voa1\phi2) \quad (56)$$

Substituting the equations (51) and (52) into the equations (55) and (56) respectively yields the following equations:

$$V2\phi1 - V1\phi1 = G \times (-Vh1 - Voh1) + G \times (Voa2\phi1 - Voa1\phi1) \quad (57) \text{ and}$$

$$V2\phi2 - V1\phi2 = G \times (+Vh2 - Voh2) + G \times (Voa2\phi2 - Voa1\phi2) \quad (58)$$

The configuration comprised of the capacitors C1 to C4, the comparator 1, and the switches S1 and S2 is the same as the configuration illustrated in FIG. 1 and performs the same operation as in FIG. 1. The output of the differential amplifier 4 is connected to the input terminal N1 connected to the other terminal of the capacitor C1 and the input terminal N2 connected to the other terminal of the capacitor C2. A signal voltage corresponding to a magnetic field intensity from the hall element 2 through the switch circuit 3, and an offset voltage being an error component are inputted to the input terminals N1 and N2. Further, the input terminal N3 connected to the other terminal of the capacitor C3 is connected to the positive electrode of the reference voltage circuit ref1 and supplied with a reference voltage Vref1 from the reference voltage circuit ref1. The input terminal N4 connected to the other terminal of the capacitor C4 is connected to the positive electrode of the reference voltage circuit ref2 and supplied with a reference voltage Vref2 from the reference voltage circuit ref2. The reference voltage input terminal Nref connected to the other terminal of the switch S2 is connected to the positive electrode of the reference voltage circuit ref0 and supplied with a reference voltage Vref0 from the reference voltage circuit rem.

Since the configuration comprised of the capacitors C1 to C4, the comparator 1, and the switches S1 and S2 performs the same operation as the configuration illustrated in FIG. 1, the output of the comparator 1 in the comparison phase φ2 becomes similar to the equation (25). Here, for convenience of description, the capacitance values of the capacitors C1 and C2 are assumed to be equal to the capacitance value C, and the capacitance values of the capacitors C3 and C4 are assumed to be equal to n times the capacitance value C.

$$Vo\phi 2 = A1 \times \{(\Delta Vin - n \times \Delta Vref)(1+n) + (Voa\phi 2 - Voa\phi 1)\} \quad (25)$$

Substituting the equations (56) and (58) into the equation (26) and rewriting the equation (27) yields the following:

$$\Delta Vin = G \times \{(Vh2 + Vh1) - (Voh2 - Voh1)\} + G \times \{(Voa2\phi 2 - Voa2\phi 1) - (Voa1\phi 2 - Voa1\phi 1)\} \quad (59) \text{ and}$$

$$\Delta Vref = -\{(Vref2\phi 2 - Vref1\phi 2) - (Vref2\phi 1 - Vref1\phi 1)\} \quad (60)$$

Now, although the input offset voltages Voa1, Voa2, and Voa of the differential amplifier 4 and the comparator 1 are not constant values because they strictly indicate a temporary change in each input offset voltage and a change therein with temperature (temperature drift), the values of the input offset voltages can be assumed to be values approximately equal in the sample phase φ1 and the comparison phase φ2 if the times for the sample phase φ1 and the comparison phase φ2 are sufficiently short with respect to the temporary change in the input offset voltage and the change in the input offset voltage with temperature. Accordingly, in the equations (25) and (59), Voaφ2−Voaφ1 and Voa2φ2−Voa2φ1, and Voa1φ2−Voa1φ1 become a value of approximately zero, and the offset components of the differential amplifier 4 and the comparator 1 are removed at the comparison operation of the comparator 1 in the comparison phase φ2.

Further, since the element offset voltage Voh of the hall element 2 generally has a characteristic in which it becomes approximately equal values in the first detection state T1 and the second detection state T2, Voh2−Voh1 becomes a value of approximately zero. Thus, the element offset components are removed at the comparison operation of the comparator 1 in the comparison phase φ2. When these components to be removed are eliminated from the equations (25) and (59), the following equations are obtained:

$$Vo\phi 2 = A1 \times \{(\Delta Vin - n \times \Delta Vref)/(1+n)\} \quad (61) \text{ and}$$

$$\Delta Vin = G \times (Vh2 + Vh1) \quad (62)$$

Thus, a result of comparison between a voltage component ΔVsig obtained by amplifying the sum of the element signal voltages Vh in the first and second detection states T1 and T2 of the hall element 2 with the amplification factor G of the differential amplifier 4, and a voltage obtained by amplifying the voltage component ΔVref supplied from the detection voltage setting circuit 5 with the ratio of the capacitance values of the capacitors C1 to C4 is eventually outputted as a high level signal or a low level signal from the output terminal OUT of the comparator 1.

To summarize the above, as represented by the above equations (61), (62), and (60), the magnetic sensor device having applied the comparison circuit of the present invention is capable of removing all offset components generated in the hall element 2, the differential amplifier 4, and the comparator 1, comparing each signal component of the hall element and the reference voltage, and hence realizing the highly accurate detection of a magnetic field intensity. Further, in the ideal hall element, the element in-phase voltages Vcm1 and Vcm2 in the first detection state T1 and the second detection state T2 are equal to each other, but are not necessarily equal in value in the actual hall element. This also causes an error to occur in the highly accurate detection of the magnetic field intensity. In the magnetic sensor device having applied the comparison circuit of the present invention, as represented by the equations (61), (62), and (60), their terms are not included in the equation indicative of the result of comparison, and the highly accurate detection of the magnetic field intensity from which the nonideal component of the in-phase voltage of the hall element is removed is realized. Also, the magnetic sensor device having applied the comparison circuit of the present invention is capable of detecting the magnetic field intensity in the two phases of the sample phase φ1 and the comparison phase φ2, and realizes high-speed and highly accurate detection of the magnetic field intensity without needing complex signal processing steps. Further, the reference voltage component ΔVref compared with the signal components of the hall element can arbitrarily be set by the values in the sample phase φ1 of the reference voltage circuit ref1 and the reference voltage circuit ref2 and the values in the comparison phase φ2 thereof as expressed in the equation (60). That is, the magnetic field intensity to be detected can arbitrarily be set by arbitrarily setting the reference voltage. Further, since the sensitivity of the hall element generally has temperature dependency, the signal voltage corresponding to the magnetic field intensity outputted from the hall element 2 also has temperature dependency. In order to correct it, for example, the reference voltage circuit ref1 and the reference voltage circuit ref2 are caused to have temperature dependency, thereby making it possible to suppress the temperature dependency of the magnetic field intensity to be detected. The above has shown that the highly accurate detection of the magnetic field intensity is realized by applying the comparison circuit of the present invention to the magnetic sensor device.

Although the present description has been made by taking the magnetic sensor as the example of the sensor element and made particularly about the example using the hall element, there is no limitation if applicable sensor elements are used as the sensor element. For example, a sensor element which outputs a voltage according to acceleration or pressure or the like, and a sensor element whose resistance value changes according to a physical quantity are also widely applicable.

One example of the circuit configuration of the differential amplifier 4 being the element which configures the magnetic sensor device of FIG. 4 will be illustrated here.

Figure 5:
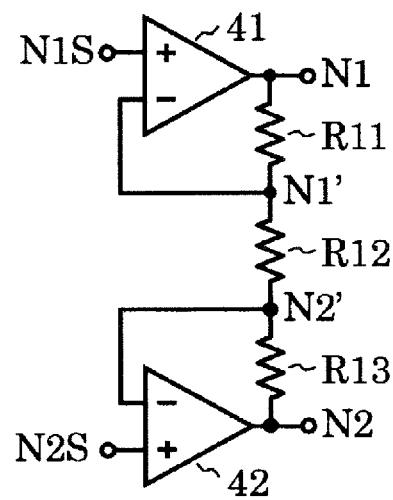
FIG. 5 is a circuit diagram illustrating one example of a differential amplifier used in the magnetic sensor device.

FIG. 5 is a circuit diagram illustrating one example of the differential amplifier used in the magnetic sensor device.

The differential amplifier 4 of FIG. 5 is equipped with differential amplifiers 41 and 42, and resistors R11, R12, and R13. The differential amplifier 4 has a first input terminal N1S connected to a non-inversion input terminal of the differential amplifier 41, a second input terminal N2S connected to a non-inversion input terminal of the differential amplifier 42, a first output terminal N1 connected to an output terminal of the differential amplifier 41, and a second output terminal N2 connected to an output terminal of the differential amplifier 42. The resistors R11, R12, and R13 are connected in series between the first output terminal N1 and the second output terminal N2. A connecting point N1' of the resistors R11 and R12 is connected to an inversion input terminal of the differential amplifier 41. A connecting point N2' of the resistors R12 and R13 is connected to an inversion input terminal of the differential amplifier 42.

The differential amplifier 4 is connected in the above-described manner and operated as follows:

The differential amplifier 41 is operated as a non-inversion amplifier and operated in such a manner that the connecting point N1' connected to the inversion input terminal becomes approximately equal to the first input terminal N1S connected to the non-inversion input terminal. Further, the differential amplifier 42 is operated as a non-inversion amplifier and operated in such a manner that the connecting point N2' connected to the inversion input terminal becomes approximately equal to the second input terminal N2S connected to the non-inversion input terminal. Moreover, since currents flowing through the resistors R11, R12, and R13 are equal, the following equations are obtained.

$$(V1-V1S)/R11=(V1S-V2S)/R12 \quad (63) \text{ and}$$

$$(V2S-V2)/R13=(V1S-V2S)/R12 \quad (64)$$

Here, the voltages of the first input terminal N1S, the second input terminal N2S, the first output terminal N1, and the second output terminal N2 are respectively assumed to be V1S, V2S, V1, and V2. Calculating V1 and V2 from the equations (63) and (64) yields the following:

$$V1=-(R11/R12+1/2)\times(V2S-V1S)+(V2S+V1S)/2 \quad (65) \text{ and}$$

$$V2=+(R13/R12+1/2)\times(V2S-V1S)+(V2S+V1S)/2 \quad (66)$$

Assuming that the terms in parentheses including the resistors of the right sides of the equations (65) and (66) are amplification factors G1 and G2, and are set as follows:

$$G1=R11/R12+1/2 \quad (67) \text{ and}$$

$$G2=R13/R12+1/2 \quad (68),$$

the equations (65) and (66) are expressed as follows:

$$V1=-G1\times(V2S-V1S)+(V2S+V1S)/2 \quad (69) \text{ and}$$

$$V2=+G2\times(V2S-V1S)+(V2S+V1S)/2 \quad (70)$$

Calculating V2−V1 from the equations (69) and (70) yields the following:

$$V2-V1=(G1+G2)\times(V2S-V1S) \quad (71)$$

Now assuming that the amplification factor G is defined as follows:

$$G=G1+G2 \quad (72),$$

the equation (71) is expressed as follows:

$$V2-V1=G1\times(V2S-V1S) \quad (73)$$

The same result as the equation (53) is obtained. That is, the circuit example illustrated in FIG. 5 has the function of amplifying the difference between the two input voltages and outputting it as the difference between the two output voltages. Further, the circuit example illustrated in FIG. 5 is capable of suppressing the influence of in-phase noise at the input by setting such an instrumentation amplifier configuration. Incidentally, since the amplification factor G is expressed in the following manner from the equation (72) and the equations (67) and (68):

$$G=(R11+R12+R13)/R12 \quad (74),$$

the amplification factor G can arbitrarily be set by the resistors R11, R12, and R13.

One example of the circuit configuration of the detection voltage setting circuit 5 being the element which configures the magnetic sensor device of FIG. 4 will next be illustrated.

Figure 6:
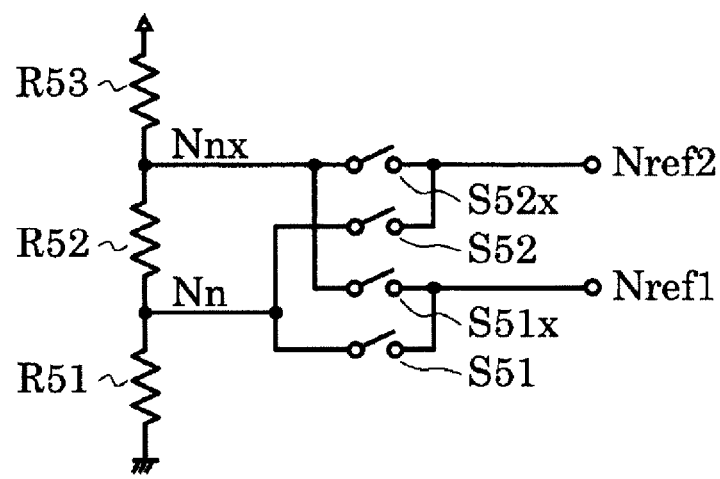
FIG. 6 is a circuit diagram illustrating one example of a detection voltage setting circuit used in the magnetic sensor device.
Figure 7:
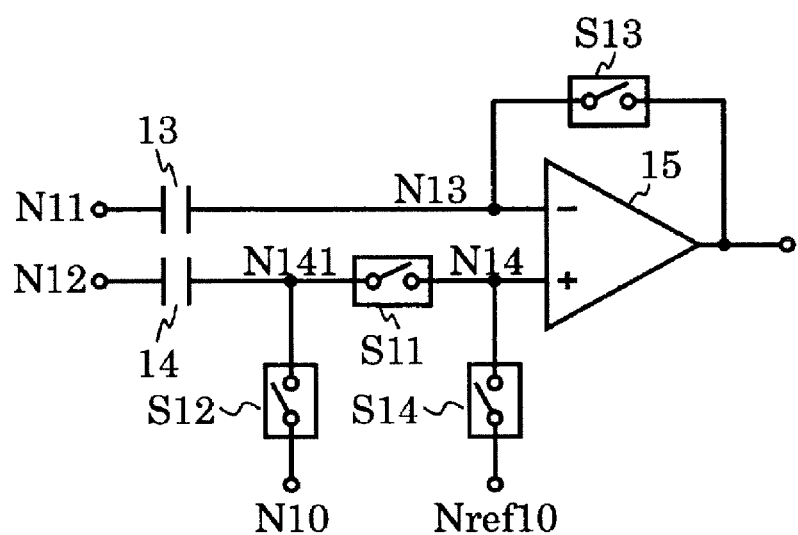
FIG. 7 is a circuit diagram of a related art comparison circuit.
Figure 8:
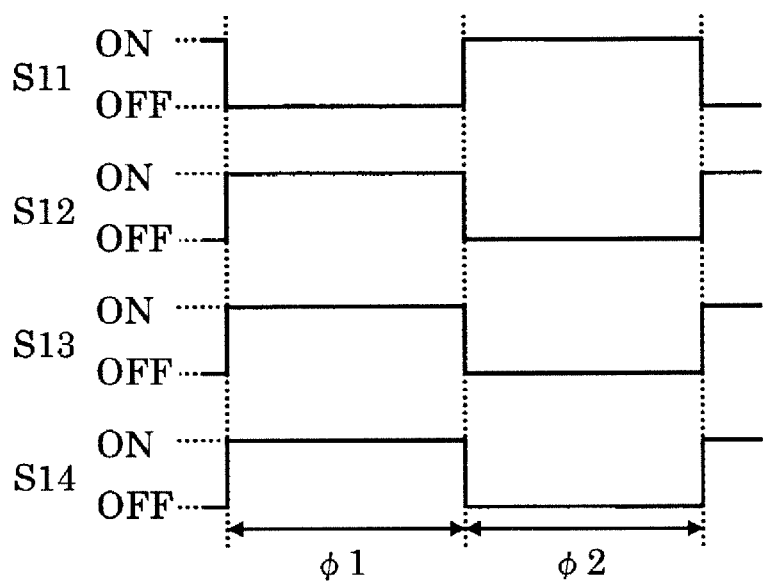
FIG. 8 is a diagram illustrating the operation of each switch in the related art comparison circuit.

FIG. 6 is a circuit diagram illustrating one example of the detection voltage setting circuit 5 used in the magnetic sensor device. The detection voltage setting circuit 5 of FIG. 6 has resistors R51, R52, and R53, and switches S51, S51x, S52, and S52x and are connected and configured in the following manner. The resistors R53, R52, and R51 are connected in series between a positive power supply voltage terminal (hereinafter called a power supply voltage terminal) VDD and a negative power supply voltage terminal (hereinafter called a ground terminal) VSS. A connecting point of the resistors R51 and R52 is assumed to be Nn, and a connecting point of the resistors R52 and R53 is assumed to be Nnx. The switches S51, S51x, S52, and S52x respectively have two terminals and are controlled to be ON or OFF by a switch control signal (not shown). One terminal of the switch S51 is connected to the connecting point Nn, and the other terminal thereof is connected to a positive electrode Nref1 of the reference voltage circuit ref1. One terminal of the switch S51x is connected to the connecting point Nnx, and the other terminal thereof is connected to the positive electrode Nref1 of the reference voltage circuit ref1. One terminal of the switch S52 is connected to the connecting point Nn, and the other terminal thereof is connected to a positive electrode Nref2 of the reference voltage circuit ref2. One terminal of the switch S52x is connected to the connecting point Nnx, and the other terminal thereof is connected to the positive electrode Nref2 of the reference voltage circuit ref2. The following description will be made assuming that the voltages of the power supply voltage terminal VDD and the ground terminal VSS are respectively VDD and VSS, the voltages of the connecting points Nn and Nnx are respectively Vn and Vnx, and the voltages of the positive electrode Nref1 of the reference voltage circuit ref1 and the positive electrode Nref2 of the reference voltage circuit ref2 are respectively reference voltages Vref1 and Vref2.

The detection voltage setting circuit 5 is connected in the above-described manner and operated in the following manner.

Since the voltages of the connecting points Nn and Nnx are voltages obtained by dividing VDD and VSS by the resistors R53, R52, and R51, Vn and Vnx are as follows:

$$Vn=R51/(R51+R52+R53)\times(VDD-VSS) \quad (75) \text{ and}$$

$$Vnx=(R51+R52)/(R51+R52+R53)\times(VDD-VSS) \quad (76).$$

The voltages Vn and Vnx can arbitrarily be set by the resistors R51, R52, and R53.

The switches S51 and S51x are controlled such that either one thereof is turned ON and the other thereof is turned OFF. Thus, either the voltage Vn or Vnx is outputted as Vref1. Further, the switches S52 and S52x are also similarly controlled such that either one thereof is turned ON and the other thereof is turned OFF. Thus, either the voltage Vn or Vnx is outputted as Vref2. A description will be made of as one example, the case where the switch S51 is turned ON in the sample phase φ1 and turned OFF in the comparison phase φ2, the switch S51x is turned OFF in the sample phase φ1 and turned ON in the comparison phase φ2, the switch S52 is turned ON in the sample and comparison phases φ1 and φ2, and the switch S52x is turned OFF in the sample and comparison phases φ1 and φ2.

Since the respective switches are controlled as described above, the reference voltages Vref1 and Vref2 in the respective phases are as follows:

$$Vref1\phi1=Vn$$

$$Vref1\phi2=Vnx$$

$$Vref2\phi1=Vn, \text{ and}$$

$$Vref2\phi2=Vn$$

Since the positive electrode Nref1 of the reference voltage circuit ref1 and the positive electrode Nref2 of the reference voltage circuit ref2 are respectively connected to the input terminal N3 and the input terminal N4 in the magnetic sensor device illustrated in FIG. 4, ΔVref is expressed as follows from the above equations and the equation (60):

$$\Delta Vref=(Vnx-Vn) \tag{77}$$

Accordingly, ΔVref compared with each signal component from the hall element 2 by the comparator 1 is given by the difference between the arbitrarily settable voltages Vn and Vnx. Thus, it is possible to arbitrarily setting each reference voltage. That is, a magnetic field intensity to be detected can arbitrarily be set. Further, since the signal voltages from the hall element 2 are generally different in positive/negative sign between the S and N poles, discrimination of the S and N poles can easily be realized by the positive/negative of the sign of ΔVref. Moreover, upon the detection of the magnetic field intensity at the transition thereof from a weak state to a strong state and release of the transition of the magnetic field intensity from the strong state to the weak state, the setting of a hysteresis of the detection and the release can be realized by changing the value of ΔVref.

What is claimed is:

1. A sensor device which performs a logic output according to the strength of a physical quantity applied to a sensor element, said sensor device comprising:
   a comparison circuit comprising:
   a first capacitor;
   a second capacitor;
   a third capacitor;
   a fourth capacitor;
   a comparator having a first input terminal inputted with a first input voltage through the first capacitor and inputted with a third input voltage through the third capacitor, a second input terminal inputted with a second input voltage through the second capacitor and inputted with a fourth input voltage through the fourth capacitor, and an output terminal;
   a reference voltage terminal inputted with a reference voltage;
   a first switch which has one end connected to the first input terminal and is turned ON in a sample phase to switch the voltage of the first input terminal to a voltage of the output terminal; and
   a second switch which has one end connected to the second input terminal and is turned ON in the sample phase to switch the voltage of the second input terminal to the reference voltage;
   the sensor element;
   a switch circuit which is connected with a first terminal pair and a second terminal pair of the sensor element and performs control by switching the terminal pair supplied with a power supply and the terminal pair for outputting a signal voltage corresponding to the strength of the physical quantity, and thereby outputting a first signal voltage and a second signal voltage inputted from the terminal pairs of the sensor element; and
   a detection voltage setting circuit which outputs a first reference voltage and a second reference voltage,
   wherein a voltage based on the first signal voltage is inputted as the first input voltage, and a voltage based on the second signal voltage is inputted as the second input voltage;
   wherein the first reference voltage is inputted as the third input voltage, and the second reference voltage is inputted as the fourth input voltage;
   wherein a third reference voltage is inputted to the reference voltage terminal;
   wherein the switch circuit has a function of switching a first detection state in which a power supply is supplied to the first terminal pair of the sensor element and the signal voltage is outputted from the second terminal pair, and a second detection state in which a power supply is supplied to the second terminal pair of the sensor element and the signal voltage is outputted from the first terminal pair, and
   wherein the comparison circuit performs the logic output depending on one said first detection state and one said second detection state.

* * * * *